United States Patent [19]

Pascucci et al.

[11] Patent Number: 5,548,554
[45] Date of Patent: Aug. 20, 1996

[54] INTEGRATED PROGRAMMING CIRCUITRY FOR AN ELECTRICALLY PROGRAMMABLE SEMICONDUCTOR MEMORY DEVICE WITH REDUNDANCY

[75] Inventors: Luigi Pascucci, Milan; Silvia Padoan, Forli; Marco Maccarrone, Pavia, all of Italy

[73] Assignee: SGS-Thompson Microelectronics, S.r.l., Milan, Italy

[21] Appl. No.: 365,154

[22] Filed: Dec. 28, 1994

[30] Foreign Application Priority Data

Dec. 29, 1993 [EP] European Pat. Off. ............. 93830528

[51] Int. Cl.$^6$ ........................................ G11C 7/00
[52] U.S. Cl. ............... 365/200; 365/185.09; 365/230.02
[58] Field of Search .......................... 365/200, 185.09, 365/185.22, 230.02

[56] References Cited

U.S. PATENT DOCUMENTS

| | | | |
|---|---|---|---|
| 4,989,181 | 1/1991 | Harada | 365/200 |
| 5,109,360 | 4/1992 | Inazumi et al. | 365/200 |
| 5,287,310 | 2/1994 | Schreck et al. | 365/189.05 |
| 5,438,546 | 8/1995 | Ishac et al. | 365/200 |
| 5,469,391 | 11/1995 | Haraguchi | 365/200 |

FOREIGN PATENT DOCUMENTS 0313040 4/1989 European Pat. Off. ......... G11C 29/00
0486295 5/1992 European Pat. Off. ......... G06F 11/20

*Primary Examiner*—David C. Nelms
*Assistant Examiner*—Son Dinh
*Attorney, Agent, or Firm*—David V. Carlson; Bryan A. Santarelli; Seed and Berry LLP

[57] ABSTRACT

An integrated programming circuitry for an electrically programmable semiconductor memory device comprises a plurality of programming load circuits, each one associated with a respective memory matrix portion or group of columns, and a plurality of programming load control circuits, each one controlling the activation of one respective programming load circuit according to the logic state of a respective data line carrying a datum to be programmed; the memory device comprises a group of redundancy bit lines and an associated redundancy programming load circuit; each programming load control circuit comprises decoding means supplied with signals which, when a defective column address is supplied to the memory device during programming, are generated from a matrix portion identifying code stored in a non-volatile register wherein the defective column address is stored, and switch means responsive to a decoded signal at the output of said decoding means to enable the activation of the redundancy programming load circuit according to the logic state of the data signal line and to cause the inhibition of the activation of the respective programming load circuit.

7 Claims, 3 Drawing Sheets

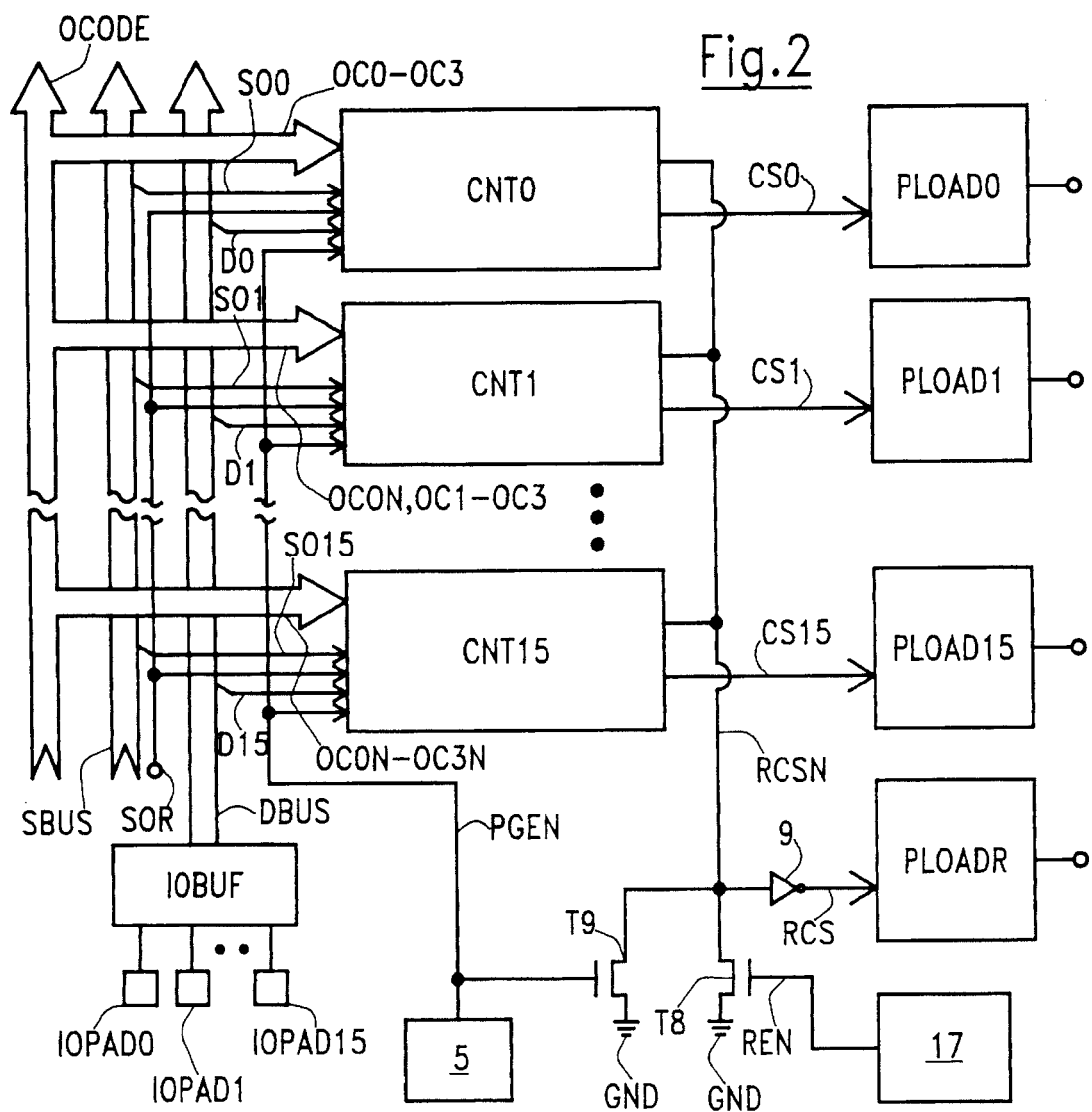
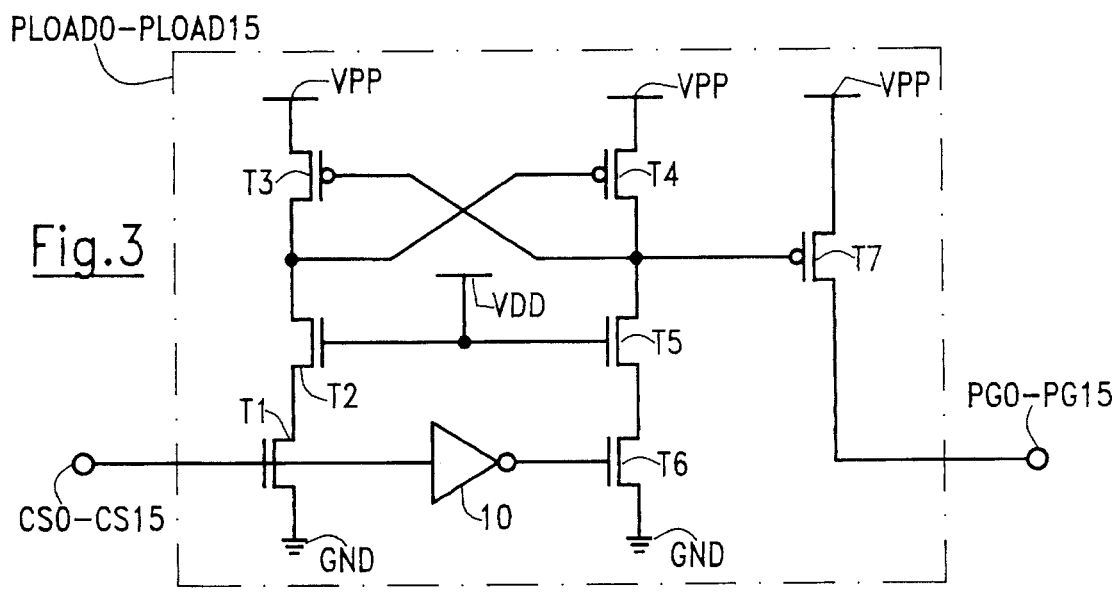

INTEGRATED PROGRAMMING CIRCUITRY FOR AN ELECTRICALLY PROGRAMMABLE SEMICONDUCTOR MEMORY DEVICE WITH REDUNDANCY

TECHNICAL FIELD

The present invention relates to an integrated programming circuitry for an electrically programmable semiconductor memory device with redundancy.

BACKGROUND OF THE INVENTION

Electrically programmable semiconductor memories, such as EPROMs, EEPROMs and Flash EEPROMs, are organized in a matrix structure wherein the single memory elements are located at the intersection of rows ("word lines") and columns ("bit lines") of the matrix: to access a given memory element, it is necessary to select the word line and bit line at the intersection of which said memory element is located; to this purpose, the memory address bus is divided into row and column address signals, which are decoded independently.

In byte- or word-organized memories, having a data bus comprising respectively eight or sixteen bits, each bit in the data bus is associated with a portion of the memory matrix which comprises a group of said bit lines; each logic configuration of the column address signals causes the simultaneous selection of one bit line in each group. Each group of bit lines is associated with a respective sensing circuitry for reading the information stored in the memory elements which belong to said portion of the memory matrix, and to a programming load circuitry for programming the memory elements connected to said group of bit lines.

It is more and more usual to provide the memory devices with an internal control circuitry to automatize the programming operation; this is especially true for Flash EEPROM devices, which are intended to be programmed on-board directly by a microcontroller and for which it is therefore desirable that the programming operation is performed without keeping the microcontroller busy. Such control circuitry allows the implementation of intelligent programming algorithms, according to which the programming voltages are applied to the selected memory elements only if they are not already in the programmed state, to avoid that the memory elements undergo unnecessary stresses so that the overall life of the device is extended, and on a repeated-pulse basis, with a program verify step after each programming pulse. Said internal control circuitry generally comprises a plurality of control circuits controlling the activation of the programming load circuitry which is associated with each of said groups of bit lines, and a central control circuitry.

It is also known that in the manufacture of semiconductor memories defects are frequently encountered that afflict a limited number of memory elements in the memory matrix. The reason for the high probability of defects of this type arises because, in a semiconductor memory device, the greatest part of the chip area is occupied by the memory matrix; moreover, it is in the memory matrix, and not in the peripheral circuitry, that the manufacturing process characteristics are usually pushed to limits.

In order to avoid that the presence of a limited number of defective memory elements forces the rejection of the entire chip, and therefore to increase the manufacturing process yield, a certain number of additional memory elements are manufactured in the memory matrix. These additional elements are commonly called "redundancy memory elements" and are used as replacement elements for those that, during testing of the memory device, prove defective. Selection circuits, with which the integrated component must necessarily be provided, and which allow the above-mentioned functional replacement of a defective memory element with a redundancy memory element are indicated as a whole with the name of "redundancy circuitry", while the set of redundancy memory elements and circuitry is defined for short as "redundancy."

The redundancy circuitry comprises programmable non-volatile memory registers suitable to store those address configurations corresponding to the defective memory elements; such registers are programmed once and for all during the memory device testing, and must retain the information stored therein even in absence of the power supply.

In practical implementations of redundancy, both word lines and bit lines of redundancy memory elements are generally provided in the memory matrix; each redundancy word line or bit line is associated with a respective non-volatile memory register, wherein the address of a defective word line or bit line is stored so that, whenever the defective word line or bit line is addressed, the corresponding redundancy word line or bit line is selected.

In a known memory matrix architecture, each of said groups of bit lines, i.e., each matrix portion which is associated with one bit in the data bus of the memory device, comprises a set of redundancy bit lines; since in the redundancy circuitry the non-volatile registers associated with the redundancy bit lines only store the logic configuration of the column address signal, the replacement of a defective bit line in one group with a redundancy bit line of the associated set causes such replacement to occur for all those bit lines in the other groups which share with the defective bit line the same column address signal logic configuration, even if they are not defective. This leads to a waste of redundancy resources, and limits the repairability rate of the memory devices.

SUMMARY OF THE INVENTION

In a matrix architecture of a preferred embodiment of the present invention, a unique set of redundancy bit lines is associated with all the groups of bit lines associated with the bits in the data bus of the memory device. In this case, the set of redundancy bit lines is associated with a redundancy sensing circuitry and with a redundancy programming circuitry. In this architecture, a defective bit line in a group of bit lines can be substituted by a redundancy bit line without causing all the bit lines in the other groups and having the same logic configuration of column address signals to be automatically substituted by respective redundancy bit lines. In other words, only the defective bit line is replaced by a redundancy bit line; all the bit lines in the other groups which share with the defective bit line the same column address are not, in contrast to the previously described architecture, replaced by respective redundancy bit lines. This requires that during testing the information regarding the group of bit lines wherein the defective bit line is found is stored in the non-volatile register associated with the redundancy bit line used to replace the defective bit line. This means that each non-volatile register in the redundancy circuitry comprises additional programmable memory cells with respect to those required in the previous architecture.

However, the repairability rate of the memory device is increased, since less redundancy bit lines are necessary to replace a given number of defective bit lines.

An object of the present invention is to realize a programming circuitry for an electrically programmable semiconductor memory device with redundancy having a memory matrix architecture according to the type described immediately above.

According to the present invention, such object is attained by means of an integrated programming circuitry for an electrically programmable semiconductor memory device which comprises a matrix of memory elements located at the intersection of rows and columns of the matrix, the columns being grouped together to form portions of the matrix associated with respective data input/output pads, and a redundancy circuitry which comprises programmable non-volatile memory registers associated with respective redundancy columns provided in the matrix and forming at least one group of redundancy columns, each non-volatile memory register being programmable to store an address of a defective column and an identifying code for identifying the matrix portion to which the defective column belongs, said programming circuitry comprising a plurality of programming load circuits, each one associated with a respective matrix portion for electrically connecting the columns of said portion to a programming voltage line when activated, a plurality of programming load control circuits, each one controlling the activation of one respective programming load circuit according to the logic state of a respective data signal line carrying a datum to be programmed, and a redundancy programming load circuit associated with said group of redundancy columns, characterized in that each programming load control circuit comprises decoding means supplied with signals which, when a defective column address is supplied to the memory device during programming, are generated from the identifying code stored in the non-volatile register wherein the defective column address is stored, and switch means responsive to a decoded signal at the output of said decoding means to enable the activation of the redundancy programming load circuit according to the logic state of said data signal line and to cause the inhibition of the activation of the respective programming load circuit.

According to the present invention, it is possible to use the already existing programming load control circuits, generally provided to control the activation of the programming load circuits associated with the groups of bit lines constituting portions of the matrix associated with respective bits in the data bus of the memory device, to control the activation of the programming load circuit associated with the group of redundancy bit lines.

According to a preferred embodiment of the invention, each programming load control circuit comprises a comparison circuit for comparing the datum carried by said data signal line with a signal carrying the datum stored in the addressed memory element, said signal representing either an output signal of a respective sensing circuit associated with the respective matrix portion when the addressed memory element belongs to a non-defective column, or an output signal of a redundancy sensing circuit associated with the group of redundancy columns when the addressed memory element belongs to a defective bit line, said comparison circuit enabling the activation either of the respective programming load circuit or of the redundancy programming load circuit only when the memory device is in the programming mode and if the addressed memory element is in the non-programmed state while the logic state of the datum carried by the data signal line corresponds to the programmed state of the memory element.

One advantage of the preferred embodiment of the invention is that when the memory device is programmed, only the addressed memory elements which are not already in the programmed condition are submitted to the programming voltage.

BRIEF DESCRIPTION OF THE DRAWINGS

FIG. 2 is a schematic diagram of a programming circuitry according to the preferred embodiment of the invention for the electrically programmable memory device of FIG. 1.

FIG. 3 is an electrical diagram of a programming load circuit of the programming circuitry of FIG. 2.

DETAILED DESCRIPTION OF THE INVENTION

An electrically programmable semiconductor memory device comprises a matrix of memory elements (not shown as such a matrix is well known to those skilled in the art) formed by the intersection of rows (word lines) and columns (bit lines); in the case of a word-organized memory device, the matrix is ideally divided into portions OD0–OD15 (FIG. 1), constituted by groups of bit lines BL, each portion OD0–OD15 being associated with a respective bit of an external data bus of the memory device. Selection means SEL0–SEL15, associated with respective matrix portions OD0–OD15 and substantially represented by multiplexing circuits, allow the selection of a given bit line BL inside the respective matrix portion OD0–OD15 by electrically connecting the selected bit line BL to a respective sensing circuit SA0–SA15 for reading the information stored in the memory elements connected to the bit lines BL which belong to said portion OD0–OD15.

The memory matrix further comprises a group RB of redundancy bit lines RBL, each of which can be used in substitution of a defective bit line BL belonging to anyone of the matrix portions OD0–OD15. The group RB of redundancy bit lines RBL is also provided with selection means SELR for the selection of a given redundancy bit line RBL, and with a redundancy sensing circuit RSA, similar to the sensing circuits SA0–SA15 associated with the matrix portions OD0–OD15.

Output signals SO0–SO15 of the sensing circuits SA0–SA15 are grouped together to form a bus SBUS; an output of the single redundancy sensing circuit RSA is represented by a signal SOR.

Each matrix portion OD0–OD15 is also associated with a respective programming load circuit PLOAD0–PLOAD15 (FIG. 2) which is in turn controlled by a respective programming load activation control circuit CNT0–CNT15. The group RB of redundancy bit lines RBL is also associated with a redundancy programming load circuit PLOADR which is similar to the programming load circuits PLOAD0–PLOAD15.

Figure 4:
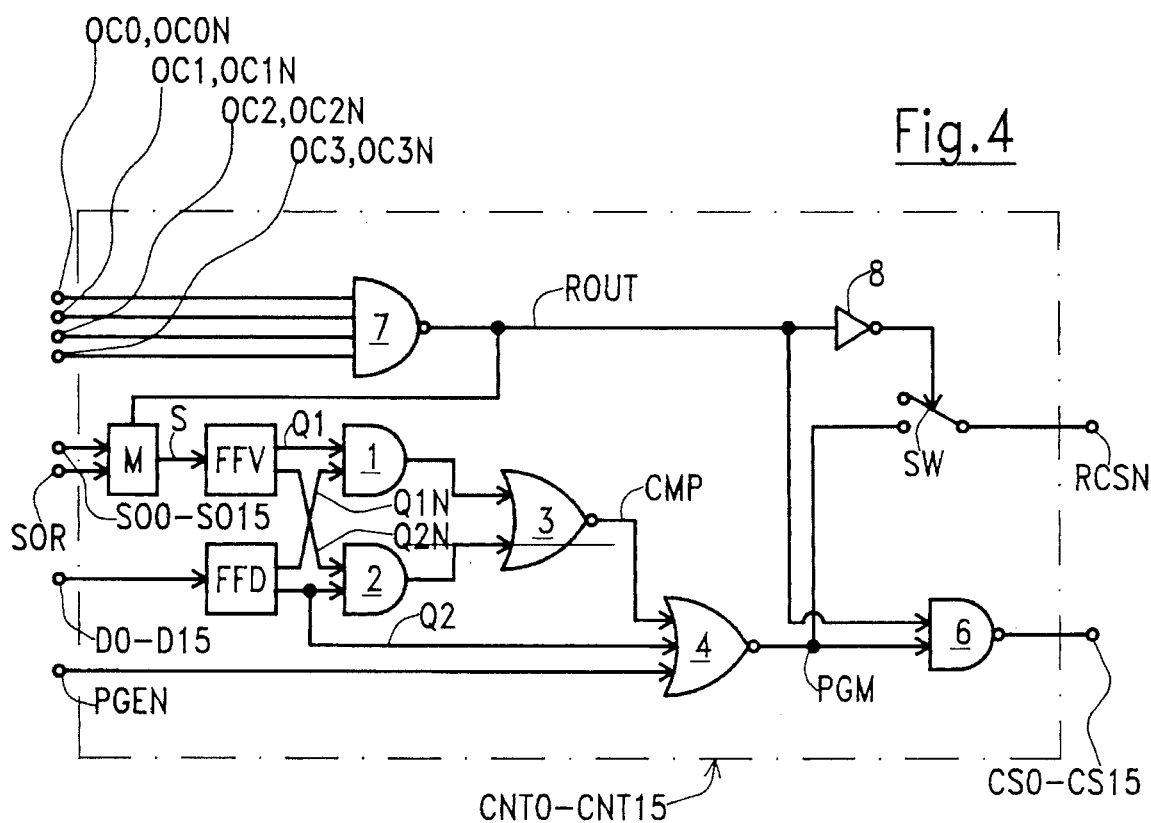
FIG. 4 is an electrical diagram of a programming load control circuit of said programming circuitry.

As shown in FIG. 4, each programming load activation control circuit CNT0–CNT15 comprises a data flip-flop FFD which is supplied with one data signal D0–D15 taken from an internal data bus DBUS; each data signal D0–D15 is connected, through a buffer circuitry IOBUF, to a respective data input/output pad IOPAD0–IOPAD15 of the memory device (FIG. 2). Each control circuit CNT0–CNT15 also comprises a verify flip-flop FFV which is supplied with an output signal S of a two-channel multiplexer M which has a first input channel supplied with one of the signals SO0–SO15 taken from the bus SBUS and a second input channel supplied with the signal SOR.

In each control circuit CNT0–CNT15, a true output Q1 of the verify flip-flop FFV is supplied to a first input of a first two-input AND gate 1, whose second input is supplied with a complemented output Q2N of the data flip-flop FFD; a complemented output Q1N of the verify flip-flop FFV is supplied to a first input of a second two-input AND gate 2, whose second input is supplied with a true output Q2 of the data flip-flop FFD. The outputs of the two AND gates 1 and 2 are supplied to a two-input NOR gate 3. The two AND gates 1 and 2, together with the NOR gate 3, constitute a comparison circuit. The output CMP of the NOR gate 3 is supplied to a first input of a three-input NOR gate 4; a second input of the NOR gate 4 is supplied with the true output Q2 of the data flip-flop FFD; a third input of the NOR gate 4 is supplied with a program enable signal PGEN which is generated by an internal control circuitry 5 of the memory device (FIG. 2). It is worth noting that, as will be more clearly explained later, the comparison circuit formed by the gates 1, 2 and 3 allows, during the programming operation of the memory device, to perform a control on the programmation condition of the single addressed memory elements, preventing those memory elements which already are in the programmed condition from being submitted to the programming voltage; this is very important in the case of Flash EEPROM devices. If however such a control is not of interest in a particular memory device, the comparison circuit 1, 2 and 3 is not necessary; each control circuit CNT0–CNT15 will therefore comprise the data flip-flop FFD, and the NOR gate 4 will have two inputs instead of three inputs.

An output signal PGM of the NOR gate 4, representing a programming load activation signal, is supplied to a first input of a two-input NAND gate 6; a second input of the NAND gate 6 is supplied with the output ROUT of a decoding circuit formed by a four-input NAND gate 7 which is supplied with four signals taken from a bus OCODE (FIG. 2); in the shown example, said bus OCODE comprises three signals 0C0–OC2 and their respective logic complements OCON–OC2N, and two more signals OC3 and OC3N, for a total of eight signals; each programming load activation control circuit CNT0–CNT15 is supplied with a different combination of four of said eight signals 0C0–OC3 and OCON–OC3N: the first control circuit CNT0 is supplied with the combination of signals OC0–0C3, the second control circuit CNT1 is supplied with the combination of signals OCON, OC1–OC3, and so on to the last control circuit CNT15, which is supplied with the combination of signals OCON–OC3N. The output signal of the NOR gate 4 is also supplied to a switch SW controlled by the output of an inverter 8 which is supplied with the output ROUT of the NAND gate 7; the signal ROUT also constitutes a control signal for the multiplexer M. The output of the NAND gate 6 represents a control signal CS0–CS15 which is supplied to the associated programming load circuit PLOAD0–PLOAD15. The outputs of all the switches SW in the control circuits CNT0–CNT15 are connected to a common signal line RCSN, which is supplied to an inverter 9; the output of the inverter 9 represents a control signal RCS for the redundancy programming load circuit PLOADR (FIG. 2).

Figure 1:
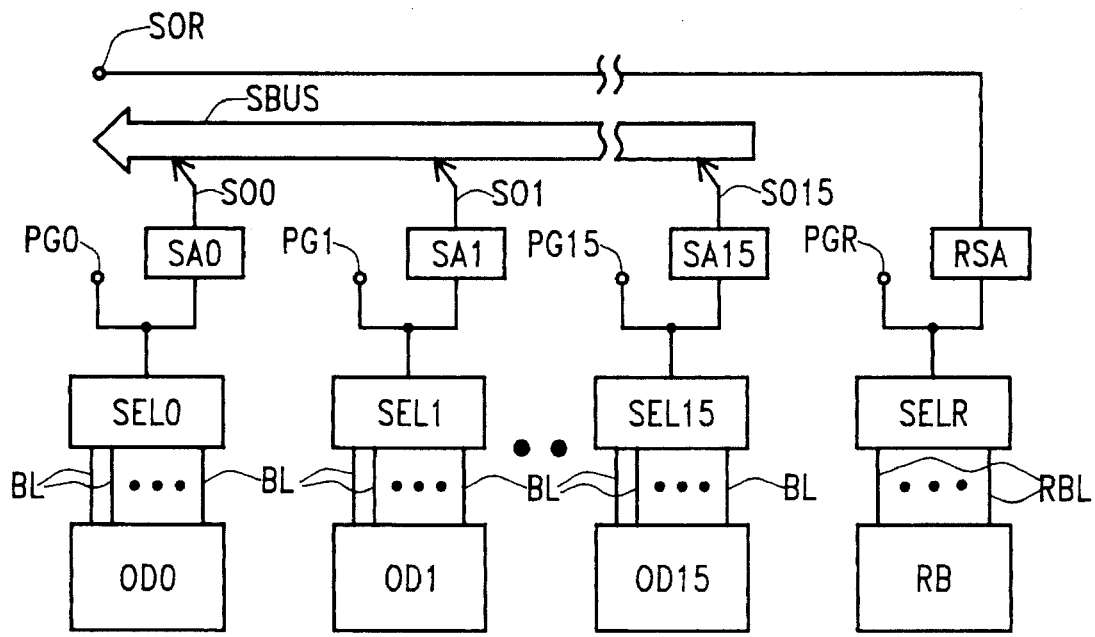
FIG. 1 is a schematic diagram of a memory matrix architecture of an electrically programmable memory device.

As shown in FIG. 3, each programming load circuit PLOAD0–PLOAD15, as well as the redundancy programming load circuit PLOAR, comprises in a per-se known way a latch circuit and a final stage; the latch circuit comprises a first N-channel MOSFET T1 with gate connected to the respective control signal CS0–CS15 or RCS, source connected to a reference voltage line GND and drain connected to the source of a second N-channel MOSFET T2 whose drain is connected to the drain of a first P-channel MOSFET T3; the source of the first P-channel MOSFET T3 is connected to a high-voltage supply VPP, typically 12 V, while its gate is connected to the drain of a second P-channel MOSFET T4 whose source is also connected to the high-voltage supply VPP and whose gate is connected to the drain of the first P-channel MOSFET T-3, in a latch configuration. The drain of the second P-channel MOSFET T4 is connected to the drain of a third N-channel MOSFET T5 whose gate is connected, together with the gate of the second N-channel MOSFET T2, to a voltage supply VDD typically of 5 V, while its source is connected to the drain of a fourth N-channel MOSFET T6 having source connected to the reference voltage line GND and gate connected to the output of an inverter 10 which is supplied with the respective control signal CS0–CS15 or RCS. The drain of the second P-channel MOSFET T4 is further connected to the gate of a third P-channel MOSFET T7, constituting the final stage, with source connected to the high voltage supply; the drain of T7 constitutes an output signal PG0–PG15 or PGR of the programming load circuit PLOAD0–PLOAD15 or PLOADR, and is connected, together with the input of a respective sensing circuit SA0–SA15 or RSA, to the output of the selection means SEL0–SEL15 or SELR (FIG. 1).

Figure 5:
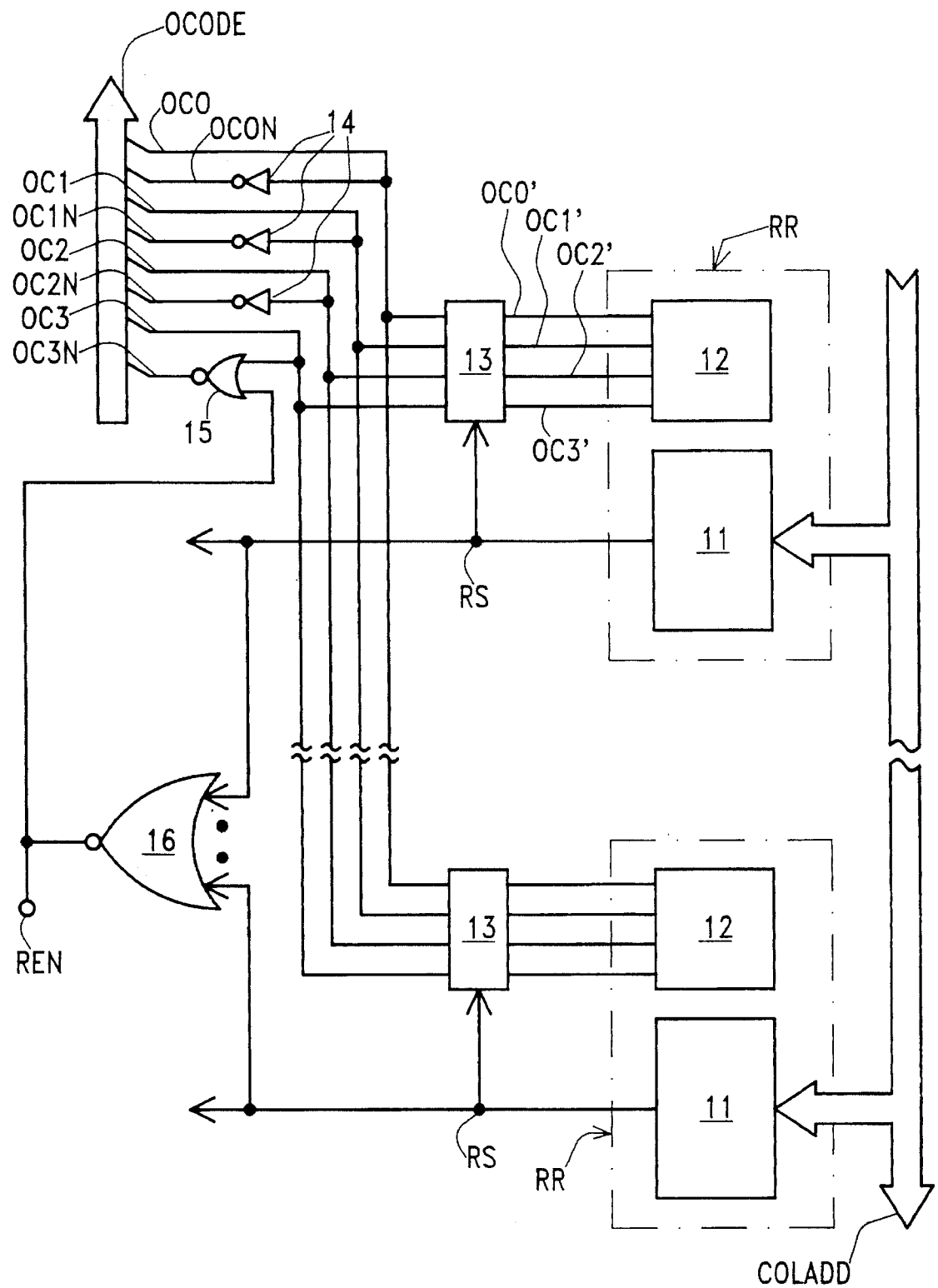
FIG. 5 is an electrical diagram of a redundancy circuitry of said electrically programmable memory device.

The memory device also comprises a redundancy circuitry 17 comprising a plurality of programmable non-volatile memory registers RR (FIG. 5); each register RR is associated with a respective redundancy bit line RBL in the group RB. Each register RR is made up of a first circuit part 11 wherein the address of a defective bit line BL is stored, and performing a comparison between the address stored therein and an address currently supplied to the memory device, represented in FIG. 5 by a bus COLADD which supplies said first circuit part 11 of the registers RR. The first circuit part 11 of each register RR generates a respective redundancy selection signal RS which is activated whenever the current address COLADD coincides with the address stored in the register RR, to select the associated redundancy bit line RBL and to deselect the defective bit line BL. Each register RR also comprises a second circuit part 12 storing in a coded form information suitable to determine in which of the matrix portions OD0–OD15 the defective bit line BL whose address is stored in the first circuit part 11 of the register RR has been found; in the shown example, four bits are sufficient to obtain the sixteen different configurations necessary to identify a given matrix portion OD0–OD15 of the memory matrix. Each bit of information is stored in a respective programmable memory cell (not shown) included in the second circuit part 12 of each register RR; the information stored in each of said memory cells appears on a respective signal line OCO'–OC3', which is supplied to a multiple switch 13 controlled by the redundancy selection signal RS of the respective register RR. The outputs of all the switches 13 are commonly connected to the signal OC0–OC3 of the OCODE bus. The signals OC0N–OC2N are generated from the signals OC0–OC2 by means of inverters 14, while the signal OC3N is generated from the signal OC3 by means of a two-input NOR gate 15, one input of which is supplied with the output REN of a NOR gate 16 supplied with all the signals RS.

The signal REN also supplies the gate of an N-channel MOSFET T8 with drain connected to the signal line RCSN and source connected to ground; another N-channel MOSFET T9 is connected to the signal line RCSN and to ground, and is controlled by the signal PGEN (FIG. 2).

When the memory device is operated in reading condition, the internal control circuitry 5 (FIG. 2) keeps the signal PGEN in the high logic state. In this condition, in all the programming load activation control circuits CNT0–CNT15 (FIG. 4), the output of the NOR gate 4 is kept in the low logic state and all the control signals CS0–CS15 are kept in the high logic state. This causes the P-channel MOSFET T7 in each one of the programming load circuits PLOAD0–PLOAD15 (FIG. 3) to be off, and the outputs PG0–PG15 are therefore left floating. The signal PGEN also causes the N-channel MOSFET T9 (FIG. 2) to be on, so that the signal line RCSN is kept to ground and the RCS is in the high logic state; again, this causes the P-channel MOSFET T7 in PLOADR to be off, and the line PGR is also left floating. In other words, when the memory device is in reading condition, the programming load circuits PLOAD0–PLOAD15 and PLOADR are disconnected from the matrix portions OD0–OD15 and from the group RB of redundancy bit lines RBL.

When the memory device is to be programmed, the data word to be programmed is externally supplied to the pads IOPAD0–IOPAD15 (FIG. 2) and is transferred, by the buffer circuitry IOBUF, to the data signals D0–D15 of the bus DBUS. Each data signal D0–D15 is latched into a respective data flip-flops FFD of the control circuits CNT0–CNT15 (FIG. 4). The memory device is also externally supplied with address signals for the selection of the memory location, i.e., the memory elements, in which the data word is to be programmed.

The internal control circuitry 5 initially keeps the signal PGEN in the high logic state, so that the programming load circuits are disconnected from the bit lines of the memory matrix; the current state of the addressed memory elements is read by the sensing circuits SA0–SA15 (FIG. 1), and appears on the signal lines SO0–SO15. If the current column address COLADD does not correspond to the address of a defective bit line, none of the redundancy selection signals RS is activated, and the signal REN is kept in the high logic state; furthermore, all the switches 13 (FIG. 5) are open, and the signals OC0–OC3 are therefore not connected to anyone of the groups of signal lines OC0'–OC3'. Since however some kind of pull-up or pull-down is generally provided to each of the signal lines OC0–OC3 to prevent them from being left floating, all the signal lines 0C0–0C3 will be in a well-defined, let's say low, logic state; the signal REN causes the output of the NOR gate 15 to be in the low logic state, so that the signal OC3N is low even if the corresponding signal 0C3 is low; this means that the configuration of the signals OC0–OC3, OC0N–OC3N does not belong to the set of sixteen configurations which can be recognized by the control circuits CNT0–CNT15. The signals ROUT of the NAND gates 7 in all the circuits CNT0–CNT15 (FIG. 4) are therefore in the high logic state, and the output channels S of the multiplexers M are connected to the respective signals SO0–SO15, which carry the data read from the memory elements currently addressed and which are to be programmed. The information is latched into the verify flip-flops FFV. The current state of the memory elements is compared with the data to be programmed thereinto by the comparison circuit represented by the gates 1, 2 and 3 in the control circuits CNT0–CNT15; if the current state of one memory element coincides with the datum to be programmed thereinto, the signal CMP is driven to the high logic state, the programming load activation signal PGM is low, and the respective control signal CS0–CS15 is also kept to "1"; in this way, when the internal control circuitry 5 drives the signal PGEN to the low logic state, the respective programming load circuit PLOAD0–PLOAD15 remains disconnected from the associated portion OD0–OD15, and the memory element is therefore not submitted to programming, since it is already in the desired state.

Let's suppose that the current state of the addressed memory element in the matrix portion OD0 does not coincide with the datum D0 to be programmed into it: the signal CMP is kept to the low logic state; if however D0 is a logic "1", which means that the current state of the addressed memory element is a logic "0", one input of the NOR gate 4 of CNT0 is high, so that when the internal control circuitry 5 drives PGEN low the programming load activation signal PGM remains in the low logic state; the signal CS0–CS15 is therefore again kept high and the programming load circuitry PLOAD0 is not activated, since the memory element does not require to be programmed, but erased.

If instead D0 is a logic "0", which means that the current state of the addressed memory element is a logic "1", when the internal control circuitry 5 drives PGEN low the programming load activation signal PGM is driven high and the control signal CS0 is driven low, and this causes the P-channel MOSFET T7 in the programming load circuit PLOAD0 to be on; the signal line PG0 is thus connected to the high voltage supplied, and the memory element can thus programmed.

After a predetermined time interval, the control circuitry 5 drives the signal PGEN high, and the information stored in the memory elements is again read by the sensing circuits SA0–SA15 to verify if the memory elements have already been programmed. Again, the current state of the memory elements is latched into the verify flip-flops FFV and compared with the datum to be programmed in them. When the internal control circuitry 5 drives PGEN low again, the programming load circuits PLOAD0–PLOAD15 are re-activated to provide a second programming pulse to those memory elements which have not been programmed by the first pulse. The operation can be repeated to obtain a programming on a repeated-pulse basis. Each time, only those memory elements which have not yet been programmed are submitted to the programming voltages.

If the column address COLADD supplied to the memory device coincides with the address of a defective bit line which during testing has been programmed into one of the non-volatile registers RR of the redundancy circuitry 17, said non-volatile register RR activates the respective signal RS; this causes the respective switch 13 to connect the signal lines OC0'–OC3' connected to the second circuit part 12 of the register RR to the signal lines OC0–OC3; furthermore, the signal REN is driven low, so that the signal OC3N is effectively the logic complement of the signal OC3. If for example the defective bit line currently addressed belongs to the matrix portion OD0, the signal lines 0C0–OC3 are all in the high logic state, and the signal ROUT in the control circuit CNT0 is low; this causes the multiplexer M to connect its output channel S to the input channel supplied with the signal SOR, so that the verify flip-flop FFV can latch the information read by the redundancy sensing circuit RSA from the redundancy memory element connected to the redundancy bit line RBL which replaces the defective bit line BL in the portion OD0. The signal ROUT also causes the selection signal CS0 to be kept to "1" independently from the logic state of the programming load activation signal PGM, thus deactivating the programming load circuit PLOAD0, while the switch SW is closed so that the signal PGM is connected to the signal line RCSN. Since the REN signal is low, when the internal control circuitry 5 drives PGEN low the two MOSFETs T8 and T9 are off, and the voltage on the RCSN line only depends on the logic state of the programming load activation signal PGM (FIGS. 2 and 4). As previously described, the logic state of the programming load activation signal PGM depends on the comparison between the current state of the redundancy memory element and the datum to be programmed in it. If the redundancy memory element has to be programmed, the RCSN signal line is high, and the RCS signal is low, thus activating the redundancy programming load circuit PLOADR. If instead the redundancy memory element shall not be submitted to programming, either because it is in a state coincident with DO or because DO is "1" and the memory element is in the "0" state, the signal RCSN is kept low and RCS is high, so that the programming load circuit PLOADR is deactivated.

The above-detailed description represents only one of many possible preferred embodiments of the present invention. As the above-detailed description will enable those skilled in the art to make various modifications to the described preferred embodiment, the present invention is limited only by the appended claims.

We claim:

1. Integrated programming circuitry for an electrically programmable semiconductor memory device which comprises a matrix of memory elements located at the intersection of rows and columns of the matrix, the columns being grouped together to form portions of the matrix associated with respective data input/output pads, and a redundancy circuitry which comprises programmable non-volatile memory registers associated with respective redundancy columns provided in the matrix and forming at least one group of redundancy columns, each non-volatile memory register being programmable to store an address of a defective column and an identifying code for identifying the matrix portion to which the defective column belongs, said programming circuitry comprising:

a plurality of programming load circuits, each one associated with a respective matrix portion for electrically connecting the columns of said portion to a programming voltage line when activated;

a plurality of programming load control circuits, each one controlling the activation of one respective programming load circuit according to the logic state of a respective data signal line carrying a datum to be programmed, and a redundancy programming load circuit associated with said group of redundancy columns, characterized in that each programming load control circuit comprises decoding means supplied with signals which, when a defective column address is supplied to the memory device during programming, are generated from the identifying code stored in the non-volatile register wherein the defective column address is stored, and switch means responsive to a decoded signal at the output of said decoding means to enable the activation of the redundancy programming load circuit according to the logic state of said data signal line and to cause the inhibition of the respective programming load circuit.

2. Integrated programming circuitry according to claim 1, characterized in that said switch means comprises a logic gate supplied with said decoded signal and with a programming load activation signal and supplying a control signal line of the respective programming load circuit, and a switch controlled by said decoded signal to transfer, when closed, said programming load activation signal to a redundancy control signal line for the redundancy programming load circuit, said decoded signal causing, when activated, the inhibition of said control signal line even if the programming load activation signal is activated, and the simultaneous closing of the switch.

3. Integrated programming circuitry according to claim 2, characterized in that each programming load control circuit comprises a comparison circuit for comparing the datum carried by said data signal line with a signal carrying the datum stored in the addressed memory element, said signal representing either an output signal of a respective sensing circuit associated with the respective matrix portion when the addressed memory element belongs to a non-defective column, or an output signal of a redundancy sensing circuit associated with the group of redundancy columns when the addressed memory element belongs to a defective bit line, said comparison circuit activating the programming load activation signal only when the memory device is in the programming mode and if the addressed memory element is in the non-programmed state while the logic state of the datum carried by the data signal line corresponds to the programmed state of the memory element.

4. A control circuit for selectively activating a programming load circuit of a programmable semiconductor matrix, the programming load circuit providing a programming voltage to a portion of the programmable semiconductor matrix, the control circuit comprising:

a decoder having a plurality of inputs and an output, wherein the decoder receives, at the plurality of inputs, a plurality of address signals, the plurality of address signals identify the portion of the programmable semiconductor matrix, wherein the output of the decoder is in a first state when the plurality of signals received at the plurality of inputs indicate that the portion of the programmable semiconductor matrix has a defective element, and wherein the output of the decoder is in a second state when the plurality of signals received at the plurality of inputs indicate that the portion of the programmable semiconductor matrix does not have a defective element;

a multiplexer having an output coupled to the output of the decoder, a first input channel connected to an output of a redundancy sensing circuit that provides a signal representing a stored datum of a redundancy memory element, and a second input channel connected to an output sensing circuit that provides a signal representing a stored datum of a memory element of the portion of the programmable semiconductor matrix, wherein the output of the multiplexer is coupled to the first input channel when the output of the decoder is in the first state, and wherein the output of the multiplexer is coupled to the second input channel when the output of the decoder is in the second state;

means for comparing the output of the multiplexer with the received datum; and means for producing the programming voltage to the portion of the programmable semiconductor matrix only when the output of the multiplexer differs from the received datum.

5. The control circuit of claim 4, further comprising:

means for suppressing the production of the programming voltage to the portion of the programmable semiconductor matrix when the output of the multiplexer is a high logic datum and the received datum is a low logic datum.

6. The control circuit of claim 4, further comprising:

means for activating a redundancy programming load circuit when the output of the decoder is in the first state.

7. The control circuit of claim 6, further comprising:

means for inhibiting the activation of the programming load circuit when the output of the decoder is in the first state.

* * * * *

UNITED STATES PATENT AND TRADEMARK OFFICE
CERTIFICATE OF CORRECTION

PATENT NO.    : 5,548,554
DATED         : August 20, 1996
INVENTOR(S)   : Luigi Pascucci, Silvia Padoan and Marco Maccarrone It is certified that error appears in the above identified patent and that said Letters Patent is hereby corrected as shown below:

On the title page:

Item [75], denoting "Inventors", following "Luigi Pascucci", please delete "Milan" and insert therefor--Sesto San Giovanni--.

Item [75], denoting "Inventors", following "Silvia Padoan", please delete "Forli" and insert therefor--Rimini--.

Item [75], denoting "Inventors", following "Marco Maccarrone", please delete "Pavia" and insert therefor--Palestro--.

Item [73], denoting "Assignee", please delete "SGS-Thompson Microelectronics, S.r.l., Agrate Brianza, Italy" and insert therefor--SGS-Thompson Microelectronics, s.r.l., Agrate Brianza (M), Italy--.

Signed and Sealed this

Fourth Day of November, 1997

Attest:

BRUCE LEHMAN

*Attesting Officer*         *Commissioner of Patents and Trademarks*

UNITED STATES PATENT AND TRADEMARK OFFICE
CERTIFICATE OF CORRECTION

PATENT NO. : 5,548,554
DATED : August 20, 1996
INVENTOR(S) : Luigi Pascucci, Silvia Padoan, Marco Maccorrone It is certified that error appears in the above-identified patent and that said Letters Patent is hereby corrected as shown below:

TITLE PAGE

[73]   Assignee:   please delete "SGS-Thompson Microelectronics, s.r.l., Agrate Brianza (M), Italy"

please insert "SGS-Thomson Microelectronics, s.r.l. Agrate Brianza (MI), Italy"

Signed and Sealed this

Sixteenth Day of March, 1999

Attest:

Q. TODD DICKINSON

Attesting Officer

Acting Commissioner of Patents and Trademarks